(12) United States Patent
He et al.

(10) Patent No.: US 12,105,984 B2
(45) Date of Patent: Oct. 1, 2024

(54) BUBBLE BREAK REGISTER IN SEMICONDUCTOR DEVICE

(71) Applicant: Micron Technology, Inc., Boise, ID (US)

(72) Inventors: Yuan He, Boise, ID (US); Pu Yang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/005,290

(22) Filed: Aug. 27, 2020

(65) Prior Publication Data

US 2022/0066681 A1 Mar. 3, 2022

(51) Int. Cl.
*G06F 3/06* (2006.01)

(52) U.S. Cl.
CPC .......... *G06F 3/0655* (2013.01); *G06F 3/0604* (2013.01); *G06F 3/0679* (2013.01)

(58) Field of Classification Search
USPC ........................................................ 711/154
See application file for complete search history.

(56) References Cited

U.S. PATENT DOCUMENTS

| | | | | |
|---|---|---|---|---|
| 5,038,282 A | * | 8/1991 | Gilbert | G06F 15/8007 712/E9.067 |
| 5,539,900 A | * | 7/1996 | Matsui | G06F 9/3822 703/26 |
| 5,809,228 A | * | 9/1998 | Langendorf | G06F 12/0215 365/189.05 |
| 6,397,299 B1 | * | 5/2002 | Meyer | G06F 12/06 711/170 |
| 7,457,897 B1 | * | 11/2008 | Lee | G06F 13/1684 710/72 |
| 8,706,952 B2 | * | 4/2014 | Hsu | G06F 12/02 365/185.11 |
| 2002/0194444 A1 | * | 12/2002 | Goodrich, II | G06F 13/1626 711/167 |
| 2005/0024932 A1 | * | 2/2005 | Ohshima | G11C 7/1069 365/158 |
| 2007/0028029 A1 | * | 2/2007 | Morein | G06F 13/1684 711/100 |
| 2010/0195396 A1 | * | 8/2010 | Higuchi | G11C 29/42 365/201 |
| 2012/0297118 A1 | * | 11/2012 | Gorobets | G06F 3/0679 711/E12.008 |
| 2014/0208005 A1 | * | 7/2014 | Simionescu | G06F 12/0804 711/103 |
| 2015/0121037 A1 | * | 4/2015 | Van Lunteren | G06F 9/3824 712/30 |
| 2016/0328163 A1 | * | 11/2016 | Yoon | G06F 11/14 |
| 2017/0139726 A1 | * | 5/2017 | Holden | G11C 14/0054 |
| 2018/0067798 A1 | * | 3/2018 | Dodson | G06F 11/1048 |

(Continued)

*Primary Examiner* — Yaima Rigol
*Assistant Examiner* — Elias Young Kim
(74) *Attorney, Agent, or Firm* — Dorsey & Whitney LLP

(57) ABSTRACT

An exemplary register circuit includes a plurality of slots to store respective addresses and data pairs. During a write operation, each slot of a plurality of slots preceding a particular slot of the plurality of slots indicated as empty is shifted by one slot to fill the particular slot such that a first end slot of the plurality of slots is made available to receive a new write address and data pair. Each slot of the plurality of slots subsequent to the particular slot retains existing address and data pairs.

16 Claims, 7 Drawing Sheets

(56) References Cited

U.S. PATENT DOCUMENTS

2018/0095675 A1* 4/2018 Kachare .............. G06F 3/0688
2019/0065107 A1* 2/2019 Prather .............. G11C 7/1015
2019/0272872 A1* 9/2019 Moschiano ........ G11C 16/0483
2020/0174697 A1* 6/2020 Brennan ............. G06F 3/0659
2021/0389876 A1* 12/2021 Muthiah ............. G06F 3/0608

* cited by examiner

BUBBLE BREAK REGISTER IN SEMICONDUCTOR DEVICE

BACKGROUND OF THE INVENTION

Semiconductor devices may use registers to store limited amounts of information, in some examples. One type of register is a first in, first out (FIFO) register. In a FIFO register, data is shifted through the register in chronological order such that, when full, the oldest data is pushed out when new data is received. When data is consumed from a particular slot in a FIFO register, that slot becomes empty. However, due to the architecture of the FIFO register that includes shifting new data into the register at a first end slot and shifting old data out at a second end slot, the empty slot remains in the register until it is shifted out of the old end slot. This may result inefficient use of the FIFO register by having empty data slots unable to be filled.

DETAILED DESCRIPTION

This disclosure describes examples of a bubble break register or buffer architecture that is configured to make complete use of the register by selectively shifting received data to fill empty slots without having to wait until the empty slots are shifted out an end slot. The bubble break register architecture includes a flag circuit and at least one data-type circuit. The flag circuit include a respective flag corresponding to each slot in the register that is configured to indicate whether a particular slot in the register currently holds valid data or not, and the data circuit includes a respective circuit corresponding to each slot to hold received data. Thus, for a particular slot, the respective flag indicates whether data stored in the respective data circuit is valid. When the respective flag for the particular slot indicates that the data is not valid (e.g., an empty slot or a bubble in the register), a shift of new data into the register may result in the empty slot being filled by shifting existing data from preceding slots by one such that a first end slot becomes available to shift in the new data, while subsequent slots storing valid data remain unaffected. For example, in a register may include four data slots, with all slots holding valid data except the third slot. When new data is received, data from the second slot may shift to fill the empty third slot, data from the first slot may shift to replace the data in the second slot, and the new data may shift into the first slot. The fourth slot may remain unaffected by the shift in this example.

In some examples, the bubble break register may be utilized to store a limited subset of address and write data information in a semiconductor device that is configurable to operate in a low latency mode. That is, in the low latency mode, the semiconductor device may utilize the bubble break register to store write data in lieu of performing a memory array access to execute the read or write command. The low latency mode of operation may be configured to support full speed calculations of certain types of applications, such as artificial intelligence (AI) or machine learning (ML) applications. The calculations performed by these applications may be iterative, data-intensive calculations that require frequent access to newly generated data.

Certain details are set forth below to provide a sufficient understanding of embodiments of the present disclosure. However, it will be clear to one skilled in the art that embodiments of the present disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Figure 1:
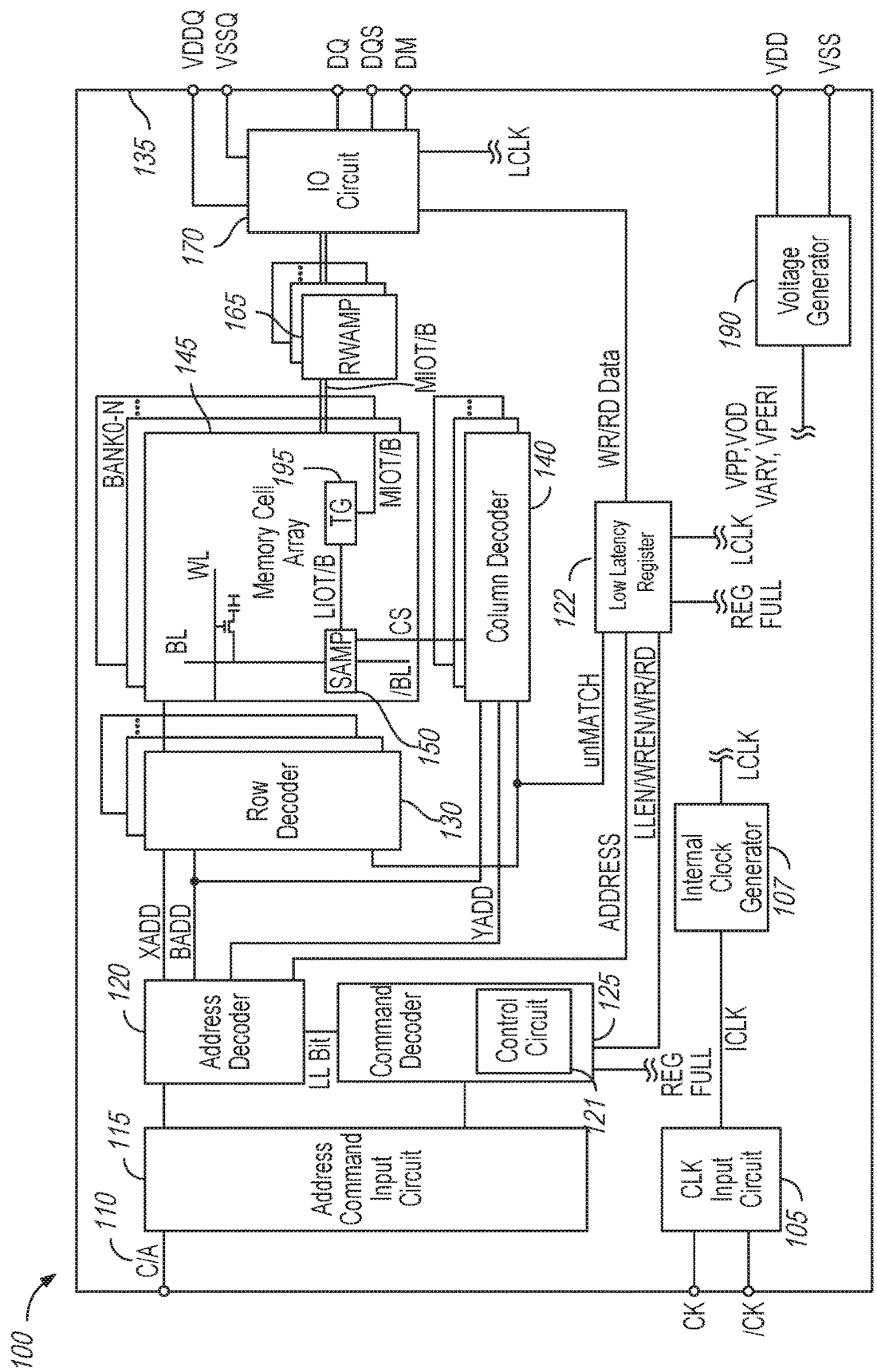
FIG. 1 is a schematic block diagram of a semiconductor device 100, in accordance with an embodiment of the present disclosure.

FIG. 1 is a schematic block diagram of a semiconductor device 100, in accordance with an embodiment of the present disclosure. For example, the semiconductor device 100 may include a chip 135. The chip 135 may include a clock input circuit 105, an internal clock generator 107, an address command input circuit 115, an address decoder 120, a command decoder 125, an control circuit 121, a low latency register 122, a plurality of row decoders 130, a memory cell array 145 including sense amplifiers 150 and transfer gates 195, a plurality of column decoders 140, a plurality of read/write amplifiers 165, an input/output (I/O) circuit 170, and a voltage generator 190. The semiconductor device 100 may include a plurality of external terminals including address and command terminals coupled to command/address bus 110, clock terminals CK and /CK, data terminals DQ, DQS, and DM, and power supply terminals VDD, VSS, VDDQ, and VSSQ. The chip 135 may be mounted on a substrate, for example, a memory module substrate, a mother board or the like.

The memory cell array 145 includes a plurality of banks BANK0-N, each bank BANK0-N including a plurality of word lines WL, a plurality of bit lines BL, and a plurality of memory cells MC arranged at intersections of the plurality of word lines WL and the plurality of bit lines BE The number of banks BANK0-N may include 2, 4, 8, 16, or any other number of banks. Each of the banks BANK0-N may divided into two or more memory planes (e.g., column planes), which may be selected by the column select CS signal from the column decoders 140. In some examples, each of the banks BANK0-N may include 2, 4, 8, 16, 32, etc., column planes. The selection of the word line WL for each bank is performed by a corresponding row decoder 130 and the selection of the bit line BL is performed by a corresponding column decoder 140. The plurality of sense amplifiers 150 are located for their corresponding bit lines BL and coupled to at least one respective local I/O line further coupled to a respective one of at least two main I/O line pairs, via transfer gates TG 195, which function as switches.

The address/command input circuit 115 may receive an address signal and a bank address signal from outside at the command/address terminals via the command/address bus 110 and transmit the address signal and the bank address signal to the address decoder 120. The address decoder 120 may decode the address signal received from the address/command input circuit 115 and provide a row address signal XADD to the row decoder 130, and a column address signal YADD to the column decoder 140. The address decoder 120 may also receive the bank address signal and provide the bank address signal BADD to the row decoder 130 and the column decoder 140.

The address/command input circuit 115 may receive a command signal from outside, such as, for example, a memory controller 105 at the command/address terminals via the command/address bus 110 and provide the command signal to the command decoder 125. The command decoder 125 may decode the command signal and provide generate various internal command signals. For example, the internal command signals may include a row command signal to select a word line, a column command signal, such as a read command or a write command, to select a bit line, and/or a low latency enable bit to enable use of the control circuit 121 and/or the low latency register 122.

Normally, when a read command is issued and a row address and a column address are timely supplied with the read command, read data is read from a memory cell in the memory cell array 145 designated by the row address and the column address. The read/write amplifiers 165 may receive the read data. DQ and provide the read data DQ to the IO circuit 170. The IO circuit 170 may provide the read data DQ to outside via the data terminals DQ, together with a data strobe signal at DQS and/or a data mask signal at DM. Similarly, when the write command is issued and a row address and a column address are timely supplied with the write command, and then the input/output circuit 170 may receive write data at the data terminals DQ, together with a data strobe signal at DQS and/or a data mask signal at DM and provide the write data via the read/write amplifiers 165 to the memory cell array 145. Thus, the write data may be written in the memory cell designated by the row address and the column address.

However, in some examples, the semiconductor device 100 may be configurable to operate in a low latency mode through use of a low latency register 122 to execute a read or write command, rather performing a memory cell array 145 access to execute the read or write command. The control circuit 121 may be configured to determine whether the semiconductor device 100 is in a low latency mode (e.g., a first mode) or a normal mode (e.g., a second mode). The low latency mode of operation may be configured to support full speed calculations of certain types of applications, such as artificial intelligence (AI) or machine learning (ML) applications. The calculations performed by these applications may be iterative, data-intensive calculations that require frequent access to newly generated data. The low latency register 122 may include registers that are capable of storing a limited subset of address and data information. Thus, to support some applications, rather than writing certain data to the memory cell array 145, the control circuit 121 may be configured to cause data to be read from or written to the low latency register 122. Operation of the low latency register 122 may be synchronous and responsive to the LCLK signal provided from the internal clock generator 107.

The control circuit 121 may determine whether an access command should be performed using the low latency mode (e.g., using the low latency register 122) or the normal mode (e.g., using the memory cell array 145). In some examples, a processor unit (e.g., a memory control unit, a memory processing unit, a graphics processing unit, a central processing unit, a general purpose graphics processing unit, a system on a chip, a field-programmable gate array, or any other type of processing unit) may direct the semiconductor device 100 to execute an access command using the low latency mode via one or more bits (e.g., a low latency enable bit) included in the command and address information, which may be provided to the semiconductor device 100 via the command and address bus 110.

The control circuit 121 may decode the command and address information to determine a value of the low latency enable bit. In response to the low latency enable bit having a first value that enables the low latency mode of operation, the control circuit 121 may direct execution of the command (e.g., read or write) received with the command and address information to the low latency register 122, either in parallel with or in addition to directing execution of the command to the memory cell array 145.

For example, while in the low latency mode of operation based on the low latency enable bit and when the command is a read command, the control circuit 121 may provide the low latency enable bit and the read command to enable the low latency register 122 to compare the address received with the command and address information (e.g., provided from the address decoder 120) with addresses stored in the low latency register 122. If a match is detected, the low latency register 122 may provide corresponding read data stored in the low latency register 122 to the IO circuit 170 responsive to the read command. In examples where the address is also provided to bank logic circuitry (e.g., the row decoders 130 and/or the column decoders 140) to initiate an access of the memory cell array 145, the low latency register 122 may provide a no match detected signal unMATCH (e.g, active low) to cause the memory cell array 145 access process to be halted or stopped if an address match is found in the low latency register 122. If no match is found, the low latency register may set the unMATCH signal, which may cause the bank logic circuitry to continue the memory cell array 145 access process to retrieve data from the memory cell array 145 based on the address. In addition to being able to provide data more quickly (e.g., with lower latency as compared with access of the memory cell array 145), the low latency register 122 configured to stop the memory cell array 145 access before access lines (e.g., column select lines, wordlines, and/or bitlines BL and /BL) and/or sense amplifiers 150 are fired may reduce power consumption in the memory, as well as may reduce susceptibility to row hammer attacks.

While in the low latency mode of operation based on the low latency enable bit and when the command is a write command, the control circuit 121 may provide the low latency enable signal, the write command, and the write enable signal; the address decoder 120 may provide the address; and the IO circuit 170 may provide the corresponding write data to the low latency register 122 for storage. In response, the low latency register 122 may store the address and write data received from the IO circuit 170 in an available slot. In some examples, if no slots are available, the control circuit 121 may cause the write data to be written to the memory cell array 145 based on the address. The control circuit 121 may determine whether a slot is available based on a register full signal REF FULL provided from the low latency register 122. In other examples, the control circuit 121 may cause data to be pushed from the low latency register 122 to the memory cell array 145 when REG FULL signal indicates that the low latency register 122 is full. In some examples, if the low latency register 122 includes previously-stored data corresponding to the received address, the previously-stored data may be marked as invalid and the new address and write data may be stored in a new slot. The process of storing write data in the low latency register 122 is faster than storing write data in the memory cell array 145, and provides faster access to the stored write data as compared with accessing stored write data in the memory cell array 145, which may improve efficiency of certain applications.

In some examples, the register 122 includes a bubble break register or buffer architecture that is configured to make complete use of the register 122 by selectively shifting received data to fill empty slots without having to wait until the empty slots are shifted out an end slot. Accordingly, the register 122 includes a flag path circuit, an address path circuit, and a write data path circuit. The flag path circuit includes respective flag latch circuits configured to provide a respective flag signal corresponding to each slot in the register 122. Each respective flag is configured to provide an indication as to whether a particular slot in the register currently holds a valid address and data. The address path circuit comprises a first set of respective latch circuits corresponding to the slots of the register 122 to store a received write addresses. The data path circuit includes a second set of respective latch-type circuits corresponding to the slots of the register 122 each configured to store received write data. The flag signals transition to indicate the respective slot has a valid respective write and address data in response to the write and address data being shifted into the respective slot, and configured to translate to indicate that the respective slot is empty in response to newer write address and data matching the write address being written into a different slot or in response to write data being read from the respective slot. When the respective flag for the particular slot indicates that the address and write data are not valid (e.g., an empty slot or a bubble in the register 122), a shift of new data into the register 122 may result in the empty slot being filled by shifting existing address and write data from preceding slots by one such that a first end slot becomes available to shift in the new address and write data, while subsequent slots storing valid address and write data remain unaffected. For example, the register 122 may include four data slots, with all slots holding valid address and write data except the third slot. When new address and write data is received, address and write data from the second slot may shift to fill the empty third slot, address and write data from the first slot may shift to replace the address and write in the second slot, and the new address and write data may shift into the first slot. The address and write data held in the fourth slot may remain unaffected by the shift, in this example.

Turning to the explanation of the external terminals included in the semiconductor device 100, the clock terminals CK and /CK may receive an external clock signal and a complementary external clock signal, respectively. The external clock signals (including complementary external clock signal) may be supplied to a clock input circuit 105. The clock input circuit 105 may receive the external clock signals and generate an internal dock signal ICLK. The clock input circuit 105 may provide the internal clock signal ICLK to an internal clock generator 107. The internal clock generator 107 may generate a phase controlled internal clock signal LCLK based on the received internal clock signal ICLK and a clock enable signal CK E from the address/command input circuit 115. Although not limited thereto, a DLL circuit may be used as the internal clock generator 107. The internal clock generator 107 may provide the phase controlled internal clock signal LCLK to the IO circuit 170. The IO circuit 170 may use the phase controller internal clock signal LCLK as a timing signal for determining an output timing of read data.

The power supply terminals may receive power supply voltages VDD and VSS. These power supply voltages VDD and VSS may be supplied to a voltage generator circuit 190. The voltage generator circuit 190 may generate various internal voltages, VPP, VOD, VARY, VPERI, and the like based on the power supply voltages VDD and VSS. The internal voltage VPP is mainly used in the row decoder 130, the internal voltages VOD and VARY are mainly used in the sense amplifiers 150 included in the memory cell array 145, and the internal voltage VPERI is used in many other circuit blocks. The power supply terminals may also receive power supply voltages VDDQ and VSSQ. The IO circuit 170 may receive the power supply voltages VDDQ and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 170.

Figure 2:
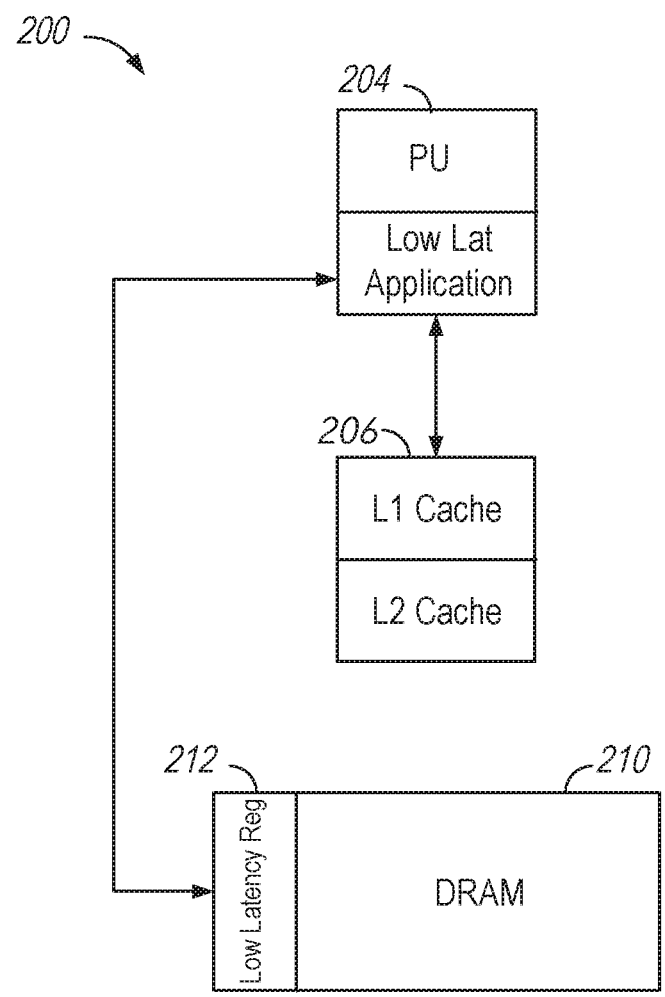
FIG. 2 is a block diagram of a computing system 200, in accordance with an embodiment of the present disclosure.

FIG. 2 is a block diagram of a computing system 200, in accordance with an embodiment of the present disclosure. The computing system 200 includes a processor unit 204 in communication with cache 206 and a DRAM 210. The DRAM 210 may include a low latency register 212 configured for use in a low latency mode.

The processor unit 204 may include any type of one or more processor units, such as a memory control unit, a memory processing unit, a graphics processing unit, a central processing unit, a general purpose graphics processing unit, a system on a chip, a field-programmable gate array, etc. The processor unit 204 may be configured to execute instructions associated with one or more applications running in the computing system. Execution of the instructions may require temporary storage of data for execution of later instructions.

The cache 206 and the DRAM 210 may facilitate the storage of data generated by the processor unit 204 during execution of instructions. The cache 206 is generally configured to provide quick (e.g., lower latency) access to frequently accessed data from the DRAM 210. The cache 206 may have a smaller size than the DRAM 210. In some examples, the cache 206 may include multiple levels, with each level varying in size and/or access latency. For example, the L1 cache of the cache 206 may have a lower capacity than the L2 cache, but may also have lower latency. The cache 206 may generally be configured to store copies of data stored at the DRAM 210. For example, the cache 206 may store data retrieved from the DRAM 210 during execution of an instruction and/or may store new data generated by the processor unit 204 during execution of an instruction, with new or updated data eventually being written to the DRAM 210. While two levels of cache are depicted in the cache 206, it is appreciated that the cache 206 may include only one level or may include three or more levels.

The DRAM 210 may have a larger capacity (e.g., by several orders of magnitude) than the cache 206, but with generally longer access latency. The DRAM 210 may include any type and/or version of DRAM, including low power DRAM, synchronous DRAM, Rambus DRAM, graphics processing DRAM, etc. Data generated by the processor unit 204 during execution of application instructions may be stored at the DRAM 210. However, while the data access operations associated with the DRAM 210 may generally be much longer than data access operations associated with the cache 206, the DRAM 210 may include a low latency register 212 that is configured to store data identified by the processor unit 204 to be low latency data. The low latency register 212 may be a smaller capacity register that is capable of storing and retrieving data more quickly than data stored to the memory array of the DRAM 210. In some examples, the processor unit 204 may direct the DRAM 210 to store low latency data at the low latency register 212 via a bit in the command and address information. The DRAM 210 may include a FIFO register, a bubble register, or any other type of register capable of storing addresses and data.

In operation, the processor unit 204 may execute instructions associated with one or more applications. The applications may include any type of application capable of being executed by the processor unit 204. During execution, the processor unit 204 may provide commands to write data to memory or to read data from memory. The cache 206 and/or the DRAM 210 may receive the write and read commands, and may perform access operations based on the commands. During normal operation, in response to a write command issued by the processor unit 204, the cache 206 may determine whether any block of the cache 206 has data associated with the address corresponding to the write command, and if so, may overwrite the data with the new write data. The new write data may eventually be stored at the DRAM 210. If no block of the cache 206 has data associated with the address, the cache 206 may load data associated with the address from the DRAM 210, and then overwrite the retrieved data with the new data, which will then be stored back at the DRAM 210.

In response to a read command issued by the processor unit 204, the cache 206 may determine whether any block of the cache 206 has data associated with the address corresponding to the read command, and if so, may return the data from the block. If no block of the cache 206 has data associated with the address, the cache 206 may load data associated with the address from the DRAM 210 into a block, and then may return the data.

However, in some examples, the processor unit 204 may operate in a low latency mode to communicate with the DRAM 210 directly to read and write data to the low latency register 212, rather than reading and writing data to the memory array of the DRAM 210. The processor unit 204 may indicate the low latency mode by setting a low latency enable bit included in the command and address information. The low latency mode of operation may be configured to support full speed calculations of certain types of applications, such as artificial intelligence (AI) or machine learning (ML) applications. The calculations performed by these applications may be iterative, data-intensive calculations that require frequent access to newly generated data. The low latency register 212 of the DRAM 210 may include registers that are capable of storing a limited subset of address and data information. Thus, to support some applications, rather than writing certain data to the memory array of the DRAM 210, the DRAM 210 may be configured to cause data to be read from or written to the low latency register 212.

The DRAM 210 may determine whether an access command should be performed using the low latency mode (e.g., using the low latency register 212) or the normal mode (e.g., using the memory array). A control circuit of the DRAM 210 may decode the command and address information to determine a value of the low latency enable bit. In response to the low latency enable bit having a first value that enables the low latency mode of operation, the control circuit may direct execution of the command (e.g., read or write) received with the command and address information to the low latency register 212, either in parallel with or in addition to directing execution of the command to the memory array. For example, while in the low latency mode of operation based on the low latency enable bit and when the command is a read command, the control circuit may enable the low latency register 212 to compare the address received with the command and address information with addresses stored in the low latency register 212. If a match is detected, the low latency register 212 may provide corresponding data stored in the low latency register 212 to the processor unit 204 responsive to the read command. In examples where the address is also provided to bank logic circuitry (e.g., row decoders and/or the column decoders) to initiate an access of the memory array, the low latency register 212 may provide a match signal to cause the memory array access process to be halted or stopped if an address match is found in the low latency register 212. If no match is found, then the DRAM 210 may continue the memory array access process to retrieve data from the memory array based on the address. In addition to being able to provide data more quickly (e.g., with lower latency as compared with access of the memory cell array), the low latency register 212 configured to stop the memory array access before access lines (e.g., wordlines and/or bitlines) and/or sense amplifiers are fired may reduce power consumption in the DRAM 210, as well as may reduce susceptibility to row hammer attacks.

While in the low latency mode of operation based on the low latency enable bit and when the command is a write command, the control circuit may provide the address and corresponding write data to the low latency register 212 for storage. In response, the low latency register 212 may store the address and corresponding write data in an available slot. In some examples, if no slots are available, the control circuit may cause the write data to be written to the memory array based on the address. The control circuit may determine whether a slot is available based on a register full signal provided from the low latency register 212. In other examples, the control circuit may cause data to be pushed from the low latency register 212 to the memory array when the low latency register 212 is full. In some examples, if the low latency register 212 includes previously-stored data corresponding to the received address, the previously-stored data may be marked as invalid and the new address and write data may be stored in a new slot. The process of storing write data in the low latency register 212 may be faster than storing write data in the memory array of the DRAM 210, and may provide faster access to the stored write data as compared with accessing stored write data in the memory array, which may improve efficiency of certain applications.

In some examples, the low latency register 212 includes a bubble break register or buffer architecture that is configured to make complete use of the low latency register 212 by selectively shifting received data to fill empty slots without having to wait until the empty slots are shifted out an end slot. Accordingly, the low latency register 212 includes a flag path circuit, an address path circuit, and a write data path circuit. The flag path circuit includes respective flag latch circuits configured to provide a respective flag signal corresponding to each slot in the low latency register 212. Each respective flag is configured to provide an indication as to whether a particular slot in the register currently holds a valid address and data. The address path circuit comprises a first set of respective latch circuits corresponding to the slots of the low latency register 212 to store a received write addresses. The data path circuit includes a second set of respective latch-type circuits corresponding to the slots of the low latency register 212 each configured to store received write data. The flag signals transition to indicate the respective slot has a valid respective write and address data in response to the write and address data being shifted into the respective slot, and configured to translate to indicate that the respective slot is empty in response to newer write address and data matching the write address being written into a different slot or in response to write data being read from the respective slot. When the respective flag for the particular slot indicates that the address and write data are not valid (e.g., an empty slot or a bubble in the low latency register 212), a shift of new data into the low latency register 212 may result in the empty slot being filled by shifting existing address and write data from preceding slots by one such that a first end slot becomes available to shift in the new address and write data, while subsequent slots storing valid address and write data remain unaffected. For example, the low latency register 212 may include four data slots, with all slots holding valid address and write data except the third slot. When new address and write data is received, address and write data from the second slot may shift to fill the empty third slot, address and write data from the first slot may shift to replace the address and write in the second slot, and the new address and write data may shift into the first slot. The address and write data held in the fourth slot may remain unaffected by the shift, in this example.

Figure 3A:
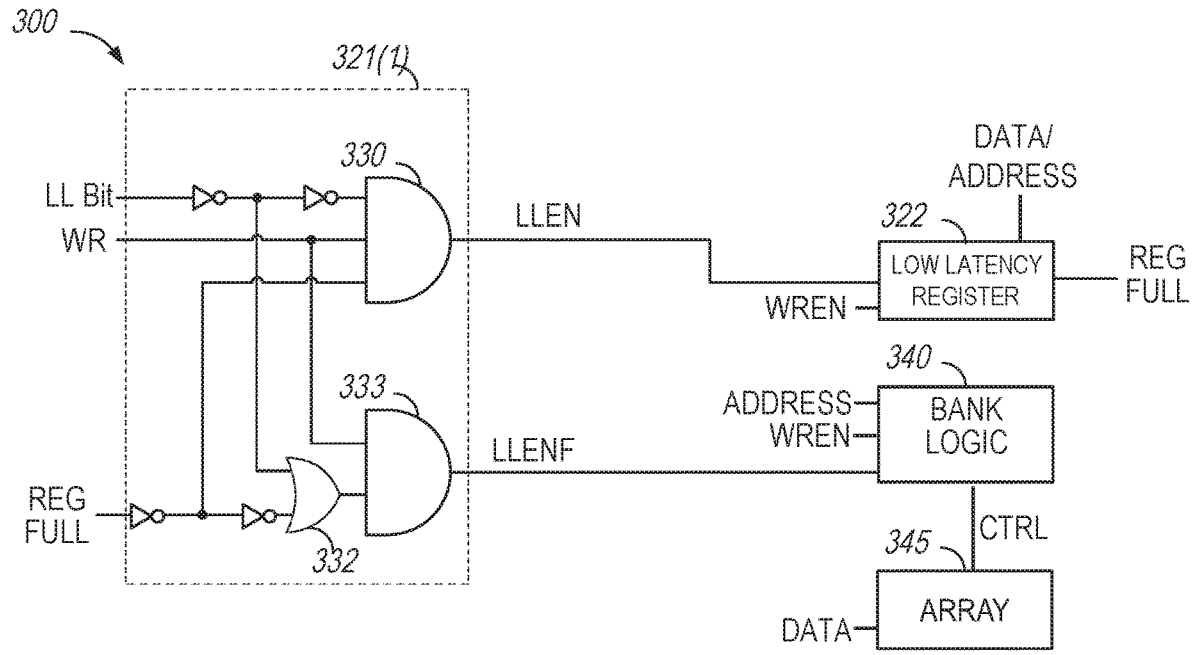
FIG. 3A is a block diagram of a logic circuitry 300 of a semiconductor device for processing a write command, in accordance with an embodiment of the present disclosure.

FIG. 3A is a block diagram of a logic circuitry 300 of a semiconductor device for processing a write command, in accordance with an embodiment of the present disclosure. The logic circuitry 300 includes a write control circuit 321(1) coupled to a low latency register 322 and a bank logic 340. The bank logic 340 is coupled to a memory array 345. The semiconductor device 100 of FIG. 1 and/or the DRAM 210 with the low latency register 212 of FIG. 2 may implement the 300, in some examples.

The write control circuit 321(1) may include a AND gate 330 and an OR gate 332 coupled to a AND gate 333, and may be configured to receive a low latency enable bit LL, a write command WR, and a register full signal REG FULL. The AND gate 330 may be configured to apply AND logic to provide an active high low latency enable signal LLEN to the low latency register 322 based on values of the LL bit, the WR command, and an inverted REG FULL signal (via an inverter). The OR gate 332 may be configured to apply OR logic to the REF FULL signal and an inverted LL bit (via an inverter) to provide a signal to the AND gate 333. The AND gate 333 may be configured to apply AND logic to the WR command and the output of the OR gate 332 to provide active low LL enable signal LLENF.

The low latency register 322 may be configured to receive the LLEN signal, a write enable signal WREN, and an address and data corresponding to the write command. In response to the LLEN signal having a first value and the WREN signal indicating a write is enabled, the low latency register 322 may be configured to store the address and data in a slot. If the low latency register 322 is full after storing the address and data, the low latency register 322 may update the REF FULL signal to indicate the low latency register 322 has no available slots. If a slot of the low latency register 322 includes a previously-stored address that matches the received address, the low latency register 322 may mark the previously-stored address slot as invalid when the received address is stored at the new slot. When the LLEN signal has a second value, no updates are made to the low latency register 322.

The bank logic 340 may be configured to receive the LLENF signal, the WREN signal, and the address and data corresponding to the write command. In response to the LLENF signal having a first value and the WREN signal indicating a write is enabled, the bank logic 340 may be configured to set control signals CTRL to cause the memory array 345 to perform a write access to store the received data to the memory array 345 at a location corresponding to the received address. If the LLENF signal has a second value, then the bank logic 340 prevents a write access to the memory array 345 from being performed via the CTRL signals.

Figure 3B:
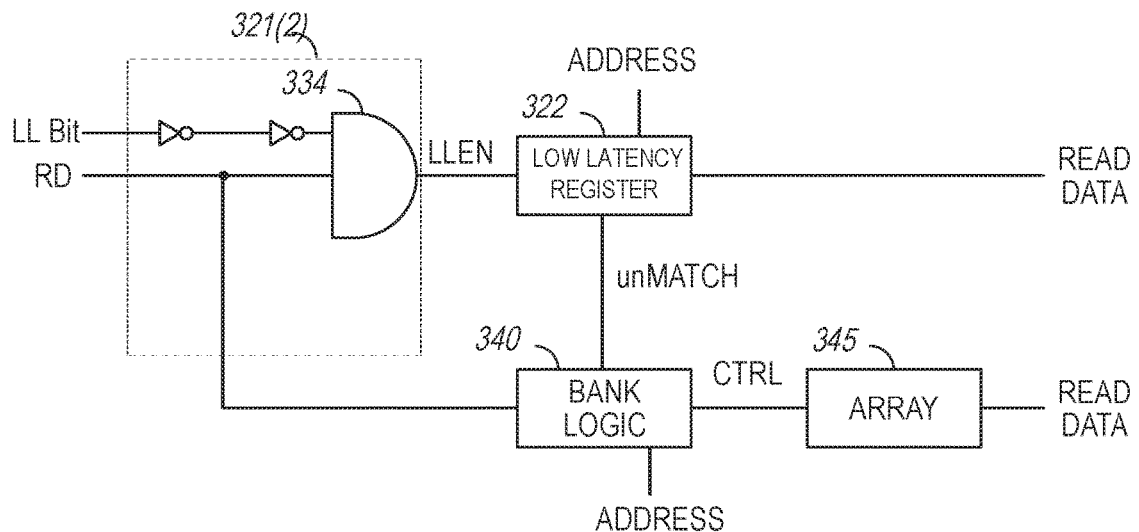
FIG. 3B is a block diagram of a logic circuitry 301 of a semiconductor device for processing a read command, in accordance with an embodiment of the present disclosure.

FIG. 3B is a block diagram of a logic circuitry 301 of a semiconductor device for processing a read command, in accordance with an embodiment of the present disclosure. The logic circuitry 301 includes a read control circuit 321(2) coupled to a low latency register 322 and a bank logic 340. The bank logic 340 is coupled to a memory array 345. The semiconductor device 100 of FIG. 1 and/or the DRAM 210 with the low latency register 212 of FIG. 2 may implement the 301, in some examples. The logic circuitry 301 may include elements that have been previously described with respect to the logic circuitry 300 of FIG. 3A. Those elements have been identified in FIG. 3B using the same reference numbers used in FIG. 3A and operation of the common elements is as previously described. Consequently, a detailed description of the operation of these particular elements will not be repeated in the interest of brevity.

The read control circuit 321(2) may include a AND gate 334, and may be configured to receive the LL bit and a read command RD. The AND gate 334 may be configured to apply AND logic to provide an active high low latency enable signal LLEN to the low latency register 322 based on values of the LL hit and the RD command. The read control circuit 321(2) may also be configured to provide the RD command to the bank logic 340.

The low latency register 322 may be configured to receive the LLEN signal and an address corresponding to the read command. In response to the LLEN signal having a first value, the low latency register 322 may be configured to search for a match between the received address and addresses stored at slots of the low latency register 322. If a match is detected, the low latency register 322 may be configured to clear an un-match signal unMATCH provided to the bank logic 340, and to provide read data from a slot corresponding to the matching address to an output. The low latency register 322 may also be configured to mark a flag associated with the matched address and data to indicate that the data has been read out, which may make the slot available to store new data. If no match is found, then the low latency register 322 may be configured to set the unMATCH signal to indicate no match is detected.

The bank logic 340 may be configured to receive the RD command, the address, and the MATCH signal. In response to the RD command, the bank logic 340 may be configured to initiate a read access of the memory array 345 based on the address. In response to the unMATCH signal being cleared, the bank logic 340 may halt or stop the read access prior to setting the CTRL signals to cause access lines and sense amplifiers to fire. If the unMATCH signal is set, the bank logic 340 may continue the read access by setting the CTRL signals to cause the memory array 345 to perform a read access to retrieve and provide read data a location of the memory array 345 corresponding to the received address.

In some examples, the low latency register 322 includes a bubble break register or buffer architecture that is configured to make complete use of the low latency register 322 by selectively shifting received data to fill empty slots without having to wait until the empty slots are shifted out an end slot. Accordingly, the low latency register 322 includes a flag path circuit, an address path circuit, and a write data path circuit. The flag path circuit includes respective flag latch circuits configured to provide a respective flag signal corresponding to each slot in the low latency register 322. Each respective flag is configured to provide an indication as to whether a particular slot in the register currently holds a valid address and data. The address path circuit comprises a first set of respective latch circuits corresponding to the slots of the low latency register 322 to store a received write addresses. The data path circuit includes a second set of respective latch-type circuits corresponding to the slots of the low latency register 322 each configured to store received write data. The flag signals transition to indicate the respective slot has a valid respective write and address data in response to the write and address data being shifted into the respective slot, and configured to translate to indicate that the respective slot is empty in response to newer write address and data matching the write address being written into a different slot or in response to write data being read from the respective slot. When the respective flag for the particular slot indicates that the address and write data are not valid (e.g., an empty slot or a bubble in the low latency register 322), a shift of new data into the low latency register 322 may result in the empty slot being filled by shifting existing address and write data from preceding slots by one such that a first end slot becomes available to shift in the new address and write data, while subsequent slots storing valid address and write data remain unaffected. For example, the low latency register 322 may include four data slots, with all slots holding valid address and write data except the third slot. When new address and write data is received, address and write data from the second slot may shift to fill the empty third slot, address and write data from the first slot may shift to replace the address and write in the second slot, and the new address and write data may shift into the first slot. The address and write data held in the fourth slot may remain unaffected by the shift, in this example.

In addition to being able to store and/or provide data more quickly (e.g., with lower latency as compared with access of the memory cell array memory array 345), the low latency register 322 of FIGS. 3A and 3B configured to stop the memory array access before access lines (e.g., wordlines and/or bitlines) and/or sense amplifiers are fired may reduce power consumption in the semiconductor device, as well as may reduce susceptibility to row hammer attacks.

Figure 4:
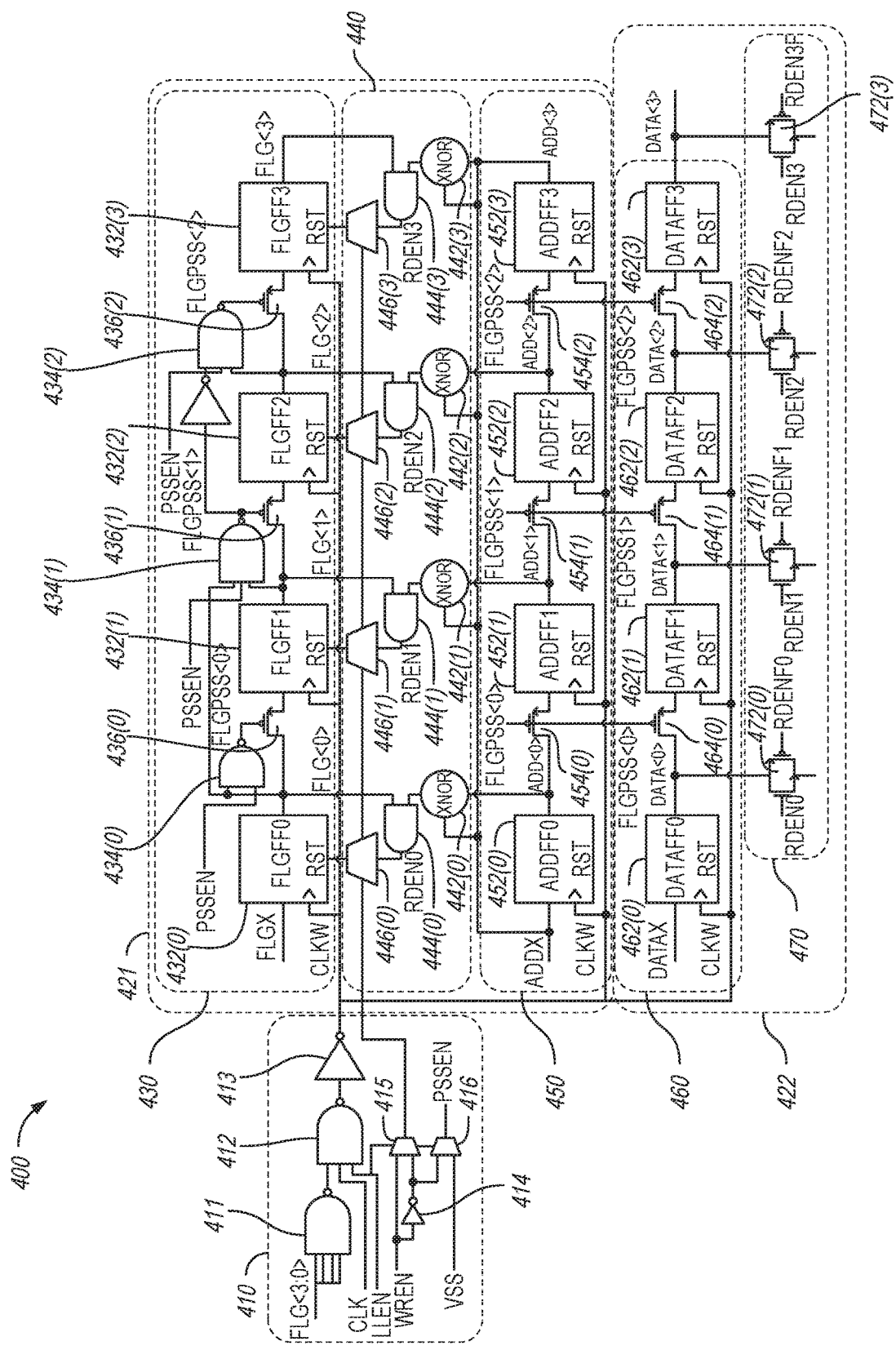
FIG. 4 is a schematic block diagram of a bubble break register circuit of a semiconductor device, in accordance with an embodiment of the present disclosure.

FIG. 4 is a schematic block diagram of a bubble break register circuit 400 of a semiconductor device, in accordance with an embodiment of the present disclosure. The bubble break register circuit 400 includes a control circuit 410; a flag/address paths 421 having a flag path circuit 430, an address match logic circuit 440, and an address path circuit 450; and a data/read path 422 having a data path circuit 460 and a read data path circuit 470. Any of the register 122 of FIG. 1, the low latency register 212 of FIG. 2, and/or the low latency register 322 of FIGS. 3A and 3B may implement the bubble break register circuit 400, in some examples.

The control circuit 410 may include a NAND gate 411 coupled to an AND gate formed by a NAND gate 412 and an inverter 413. The control circuit 410 may further include a multiplexer 415 and a multiplexer 416 each configured to complementary (e.g., active high and active low via the inverter 414) write enable signals WREN. The NAND gate 411 is configured to receive flag bits FLG<3:0> from the flag path circuit 430 that each indicate whether a particular slot of the low latency register 400 holds valid data and is configured to apply NAND logic to provide an output to the NAND gate 412 (e.g., when all of the FLG<3:0> bits are set, the output of the NAND gate 411 is set to a low logical value; otherwise it is set to a high logical value). In addition to the output of the NAND gate 411, the NAND gate 412 is configured to receive a clock signal CLK and a low latency enable signal LLEN. Based on the output of the NAND gate 411, the CLK signal, and the LLEN signal, the NAND gate 412 is configured to provide an output to the inverter 413, which inverts the output to provide a write clock signal CLKW to the 420 and the data path circuit 460 and the address path circuit 450.

The multiplexer 415 is configured to selectively provide the active high WREN signal to the address match logic circuit 440 in response to the LLEN signal having a first value and to provide the active low WREN signal (via the inverter 414) to the address match logic circuit 440 in response to the LLEN signal having a second value. The multiplexer 416 is configured to selectively provide the active low WREN signal (via the inverter 414) as the pass enable signal PSSEN in response to the LLEN signal having the first value and to provide a low voltage VSS as the PSSEN signal in response to the LLEN signal having the second value.

The flag path circuit 430 of the 420 includes a set of flag flip-flops 432(0)-(3) and the address path circuit 450 of the 420 includes a respective set of address flip-flops 452(0)-(3). In addition to the set of flag flip-flops 432(0)-(3), the flag path circuit 430 further includes a set of NAND gates 434(0)-(2) and a set of transistors 436(0)-(2). In some examples, each of the transistors 436(0)-(2) may include p-type transistors that are enabled in response to a low logic signal input at the respective gate. Each of the set of flag flip-flops 432(1)-(3) is configured to receive an output of a preceding one of the set of flag flip-flops 432(0)-(2) via the transistors 436(0)-(2), with the flag flip-flop 432(0) configured to receive an active high flag signal FLGX, and may provide the respective FLG<3:0> signal at an output. Each of the flag flip-flops 432(0)-(3) may transition a respective input signal to the respective FLG<3:0> signal at an output in response to the CLKW signal.

The NAND gate 434(0) may be configured to receive the FLG<0> signal and the PSSEN signal and may be configured to apply NAND logic based on the FLG<0> signal and the PSSEN signal to provide the FLGPSS<0> signal to the transistor 436<0>. The transistor 436<0> may be configured to selectively provide the FLG<0> signal to an input of the flag flip-flop 432(1) based on a value of the FLGPSS<0> signal.

The NAND gate 434(1) may be configured to receive the FLG<1> signal, the FLG<0> signal, and the PSSEN signal and may be configured to apply NAND logic based on the FLG<1> signal, the FLG<0> signal, and the PSSEN signal provide the FLGPSS<1> signal to the transistor 436<1> and to the NAND gate 434(2). The transistor 436<1> may be configured to selectively provide the FLG<1> signal to an input of the flag flip-flop 432(2) based on a value of the FLGPSS<1> signal.

The NAND gate 434(1) may be configured to receive an active low (via an inverter) FLGPSS<1> signal, the FLG<2> signal, and the PSSEN signal and may be configured to apply NAND logic based on the active low FLGPSS<1> signal, the FLG<2> signal, and the PSSEN signal provide the FLGPSS<2> signal to the transistor 436<2>. The transistor 436<2> may be configured to selectively provide the FLG<2> signal to an input of the flag flip-flop 432(3) based on a value of the FLGPSS<2> signal.

The address match logic circuit 440 of the 420 includes a set of XNOR gate 442(0)-(3), a set of AND gates 444(0)-(3), and a set of pass gates 446(0)-(4). Each of the set of XNOR gate 442(0)-(3) is configured to compare (e.g., using exclusive NOR logic) a received address bit ADDX with an output address bit ADD<3:0> from a respective one of the set of address flip-flops 452(0)-(3) and provide a result of the comparison to a respective one of the AND gates 444(0)-(3). Each of the set of AND gates 444(0)-(3) is configured to apply AND logic to compare the output of the respective one of the XNOR gate 442(0)-(3) with a respective FLG<3:0> signal to provide a respective read enable signal RDEN0-RDEN3. Thus, the RDEN0-RDEN3 signals each indicate that the corresponding ADD<3:0> bit is valid and it matches the received ADDX bit. Each of the RDEN0-RDEN3 signals may be passed through a respective one of the pass gates 446(0)-(3) in response to an output of the multiplexer 415 to reset a respective one of the set of flag flip-flops 432(0)-(3).

In addition to the set of address flip-flops 452(0)-(3), the address path circuit 450 further includes a set of transistors 454(0)-(2). Each of the transistors 454(0)-(2) may be configured to selectively provide a respective ADD<2:0> address from an output of the address flip-flops 452(0)-(2) to an input of a subsequent one of the address flip-flops 452(1)-(3) in response to the FLGPSS<3:0> signal. In some examples, each of the transistors 454(0)-(3) may include p-type transistors that are enabled in response to a low logic signal input at the respective gate. Thus, each of the set of address flip-flops 452(1)-(3) is configured to receive an output of a preceding one of the set of address flip-flops 452(0)-(2) via the transistors 454(0)-(2) based on the FLGPSS<2:0> signals, with the first address flip-flop 452(0) configured to receive a new address ADDX, and may provide the respective ADD<3:0> address at an output. Each of the address flip-flops 452(0)-(3) may transition a respective input signal to the respective ADD<3:0> signal at an output in response to the CLKW signal.

The data path circuit 460 of the data/read path 422 may include a set of data flip-flops 462(0)-(3) and a set of transistors 464(0)-(2). Each of the transistors 464(0)-(2) may be configured to selectively provide a respective DATA<2:0> from an output of the data flip-flops 462(0)-(2) to an input of a subsequent one of the data flip-flops 462(1)-(3) in response to the FLGPSS<2:0> signal. In some examples, each of the transistors 464(0)-(2) may include p-type transistors that are enabled in response to a low logic signal input at the respective gate. Thus, each of the set of data flip-flops 462(1)-(3) is configured to receive an output of a preceding one of the set of data flip-flops 462(0)-(2) via the transistors 464(0)-(2) based on the FLGPSS<2:0> signals, with the first address flip-flop 452(0) configured to receive a new write data DATAX, and may provide the respective DATA<3:0> at an output. Each of the data flip-flops 462(0)-(3) may transition a respective input signal to the respective DATA<3:0> signal at an output in response to the CLKW signal.

The read data path circuit 470 of the data/read path 422 may include respective pass gates 472(0)-(3) that are enabled to provide a respective one of the DATA<3:0> at an output as read data in response to a respective one of the RDEN0-RDEN3 signals (e.g., and the respective complementary RDENF0-RDENF3 signals) having a value indicating a match between the ADDX address and a corresponding valid (via the FLG<3:0>) ADD<3:0> address.

Figure 5:
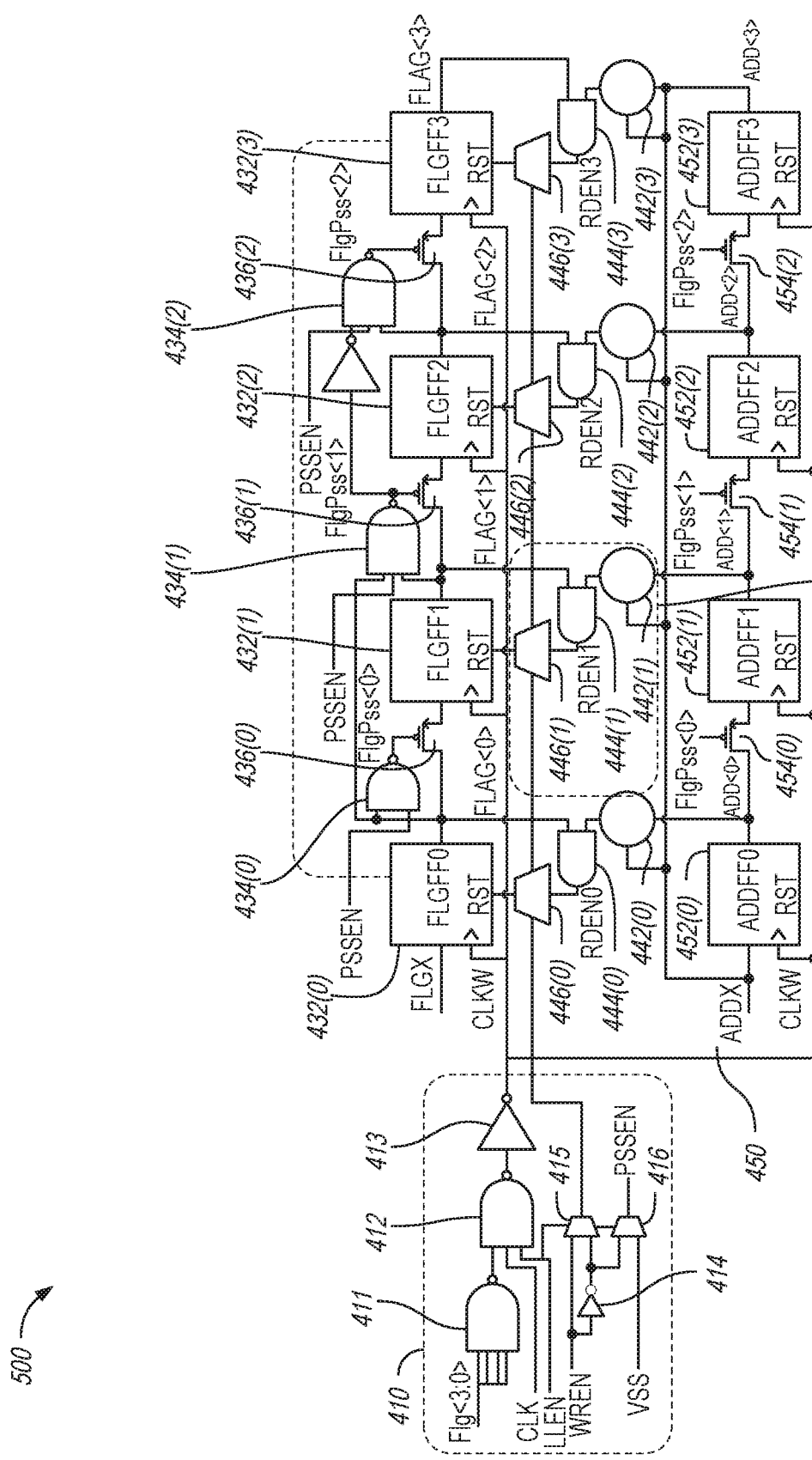
FIG. 5 depicts a schematic block diagram of a portion of the bubble break register circuit of FIG. 4 performing a write operation, in accordance with embodiments of the disclosure.
Figure 6:
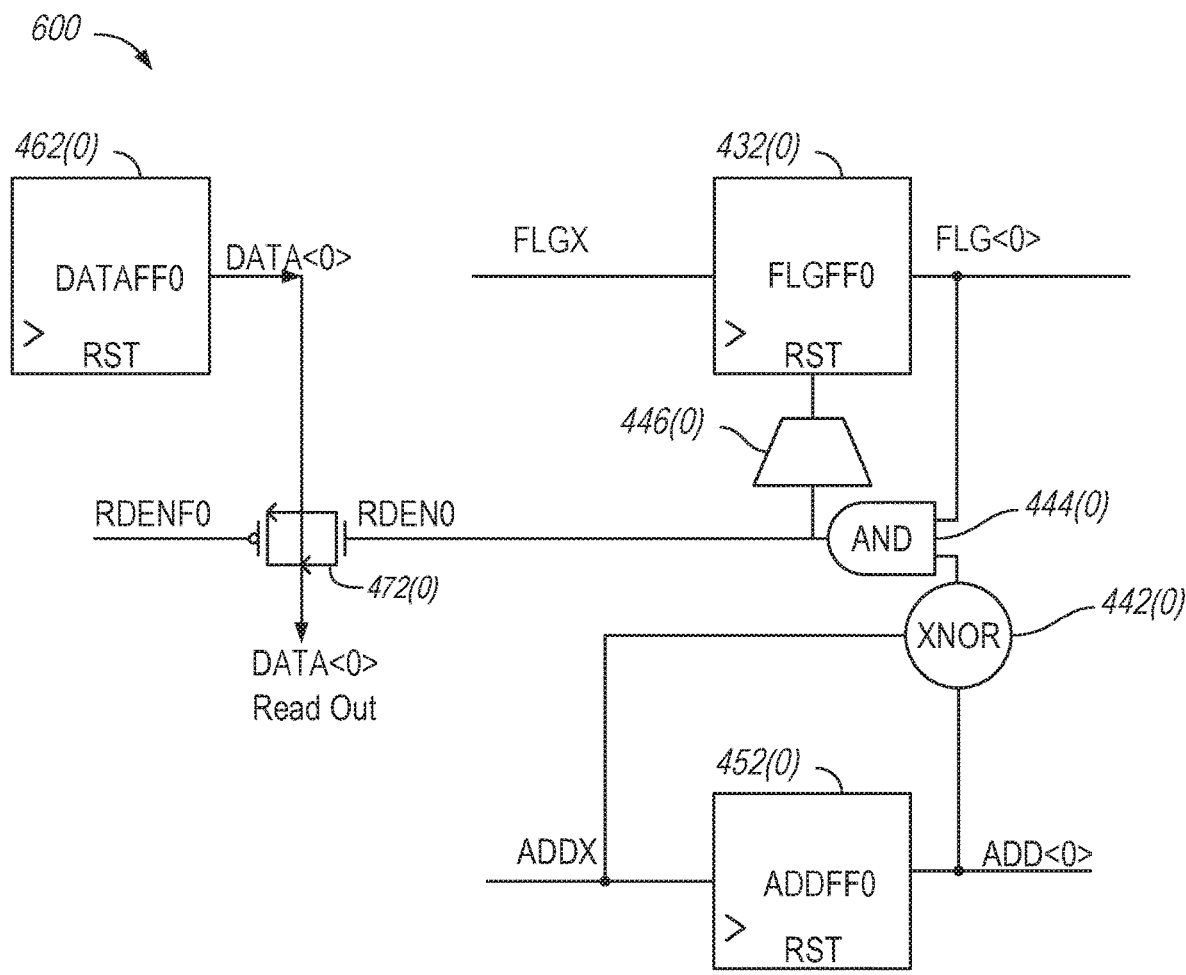
FIG. 6 depicts a schematic block diagram of a portion of the bubble break register circuit of FIG. 4 performing a read operation, in accordance with embodiments of the disclosure.

Operation of the bubble break register circuit 400 will be described with reference to FIGS. 5 and 6. FIG. 5 depicts a schematic block diagram of a portion 500 of the bubble break register circuit 400 of FIG. 4 performing a write operation, in accordance with embodiments of the disclosure. FIG. 6 depicts a schematic block diagram of a portion 600 of the bubble break register circuit 400 of FIG. 4 performing a read operation, in accordance with embodiments of the disclosure. The portion 500 of the bubble break register circuit 400 of FIG. 5 and the portion. 600 of the bubble break register circuit 400 of FIG. 6 may include elements that have been previously described with respect to the bubble break register circuit 400 of FIG. 4. Those elements have been identified in FIGS. 5 and 6 using the same reference numbers used in FIG. 4 and operation of the common elements is as previously described. Consequently, a detailed description of the operation of these particular elements will not be repeated in the interest of brevity.

Turning to FIG. 5, during a write operation, the NAND gates 434(0)-(2) and the transistors 436(0)-(2) control whether the FLG<2:0> provided from an output of a preceding one of the flag flip-flops 432(0)-(2) is provided to an input of a subsequent one of the flag flip-flops 432(1)-(3). In addition, the transistors 454(0)-(2) control whether the ADD<2:0> bit provided from an output of a preceding one of the address flip-flops 452(0)-(2) is provided to an input of a subsequent one of the address flip-flops 452(1)-(3). For example, the NAND gate 434(1) receives the FLG<0> signal, the FLG<1> signal, and the PSSEN signal. The PSSEN signal is triggered by the WREN signal, indicating a write command. Thus, during a write operation, the FLG<0> signal indicates whether or not the ADD<0> bit is valid and the FLG<1> signal indicates whether or not the ADD<1> bit is valid. If the FLG<1:0> signals indicate that both of the ADD<1:0> bits are valid, then the NAND gate 434(1) may enable the transistor 436(1) and the transistor 454(1), respectively, to provide the FLG<1> signal and the ADD<1> bit, respectively, to an input of the flag flip-flop 432(2) and the address flip-flop 452(1), respectively. In this scenario, the flag signals and the addresses are passed to the right, because all addresses are valid.

If the FLG<1> indicated that the ADD<1> address is invalid (e.g., that slot of the bubble break register 400 is empty), then the output of the NAND gate 434(1) may disable the transistor 436(1) and the transistor 454(1) to prevent the invalid FLG<1> signal and the invalid. ADD<1> address from propagating to the flag flip-flop 432(2) and the address flip-flop 452(2), respectively. Instead, shifting within in the bubble break register 400 would stop at the first empty slot within the bubble break register 400.

With reference to the read enable/reset logic circuit 570, XNOR gate 442(1) may compare whether the new address ADDX matches the ADD<1> address, and if so, may cause the flag flip-flop 432(1) to reset the FLG<1> signal to cause the ADD<1> address to be marked as invalid to avoid storage of duplicate addresses within the bubble break register 400. It is appreciated that the same principles for the read enable/reset logic circuit 570 apply to other similar logic circuits of the 540 to cause a reset of a corresponding FLG<3:0> signal in response to detection of a matching address. In addition, while not shown in FIG. 5, operation of the data path circuit 460 of FIG. 4 during a write operation is similar to operation of the address path circuit 450. That is, the addresses ADD<3:0> and the respective write data DATA<3:0> are paired together and shift together within the bubble break register 400.

Turning to FIG. 6, during a read operation, the new write address ADDX is compared with the ADD<1> address at the XNOR gate 442(0) to determine whether a match exists. The AND gate 444(0) receives the output of the XNOR gate 442(0) and the FLG<0> signal and provides the RDEN0 signal (e.g., and the complementary RDENF0 signal) to an output based on a logical AND comparison between the FLG<0> signal and the output of the XNOR gate 442<0>. That is, if the ADD<0> address matches the ADDX address AND the ADD<0> address is valid (indicated by the FLG<0> signal), then the AND gate 444(0) may provide the RDEN0 signal to enable the pass gate 472(0). In response to the RDEN0 signal enabling the pass gate 472(0), the pass gate 472(0) may provide the DATA<0> data at an output as read data. Otherwise, the pass gate 472(0) may prevent the DATA<0> data from being provided to an output as the read data (e.g., when the ADDX address does not match the ADD<0> address OR the ADD<0> address is invalid).

While the bubble break register 400 depicted in FIGS. 4-6 only depicts a single address flip-flip and single logical bit comparison for each slot, it is appreciated that the flag path circuit 430 and the address match logic circuit 440 may include additional circuitry to store and compare each bit or a subset of bits of an address to detect a match between addresses without departing from the scope of the disclosure. In addition, the address path circuit 450 may also include additional flip-flops for each slot to store each data bit corresponding to an address without departing from the scope of the disclosure. While the bubble break register 400 of FIGS. 4-6 includes 4 slots, it is appreciated that the bubble break register 400 could be expanded to include any number of slots without departing from the scope of the disclosure. In addition, while FIGS. 5 and 6 only depict respective portions 500 and 600 of the bubble break register 400 of FIG. 4, it is appreciated that other, similar portions of the bubble break register 400 may operate similarly and description of such operation is excluded in the interest of brevity.

Figure 7:
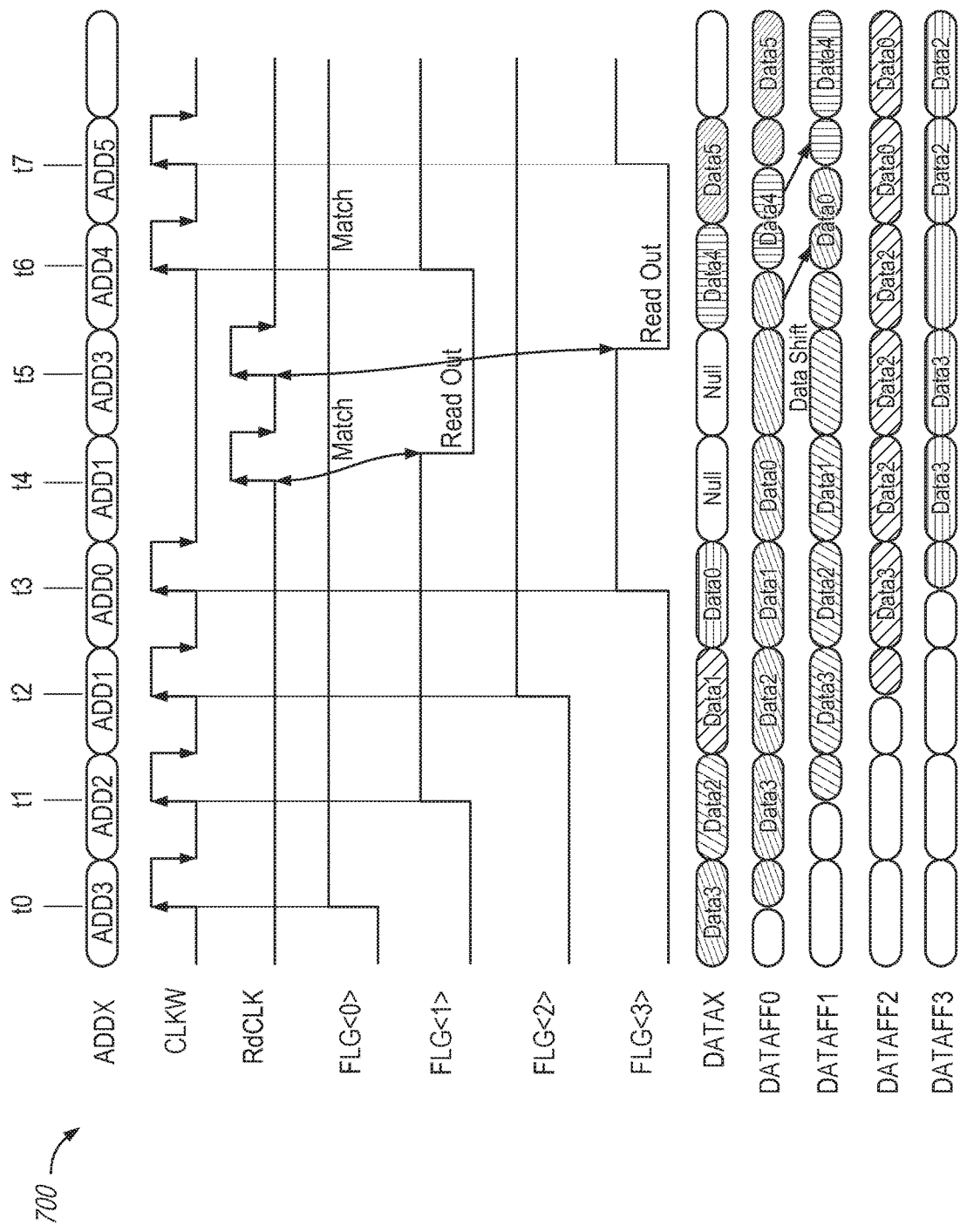
FIG. 7 includes an exemplary timing diagram of read and write accesses associated with a bubble break register, in accordance with embodiments of the disclosure.

FIG. 7 includes an exemplary timing diagram 700 of read and write accesses associated with a bubble break register, in accordance with embodiments of the disclosure. The timing diagram may be implemented by the register 122 of FIG. 1, the low latency register 212 of FIG. 2, the low latency register The ADDX signal, the CLKW signal, the FLG<3:0> signals, the DATAX data, and the DATAFF0 flip flops may correspond to the ADDX, the CLKW signal, the FLG<3:0> signals, the DATAX data, and the data flip-flops 462(0)-(3), respectively, of FIGS. 4-6. Time T0-T4 and T6-T7 depict write operations associated with the bubble break register and times T4-T6 depicted read operations associated with the bubble break register.

At time T0, in response to the CLKW signal, a first address ADD3 and first write data Data3 are received on a DATAX signal at an input of a first flip-flop slot (e.g., DATAFF0) of a bubble break register and the FLG<0> signal transitions to a high logical value. Between times T0 and T1, the Data3 begins transitioning to an output of the first-flip-flop slot/input of the second flip-flop slot (e.g., DATAFF1) based on the CLKW signal.

At time T1, in response to the CLKW signal, a second address ADD2 and second write data Data2 are received on the DATAX signal at the input of the first flip-flop slot. The FLG<0> signal remains at the high logical value because the respective slot continues to hold valid data. Also at time T1, as the Data3 data transitions to an output of the second flip-flop slot, the FLG<1> signal transitions to the high logical value. Between times T1 and T2, the Data3 begins transitioning to an output of the second-flip-flop slot/input of the third flip-flop slot (e.g., DATAFF2) and the Data2 begins transitioning to the output of the first flip-flop slot/input of the second flip-flop slot (e.g., DATAFF1) based on the CLKW signal.

At time T2, in response to the CLKW signal, a third address ADD1 and third write data Data1 are received on the DATAX signal at the input of the first flip-flop slot. The FLG<0> signal and the FLG<1> signal both remain at the high logical value because the respective slots continue to hold valid data. Also at time T2, as the Data3 data transitions from to an output of the third flip-flop slot, the FLG<2> signal transitions to the high logical value. Between times T2 and T3, the Data3 begins transitioning to an output of the third flip-flop slot/input of the fourth flip-flop slot (e.g., DATAFF3), the Data2 begins transitioning to the output of the second-flip-flop slot/input of the third flip-flop slot, and the Data1 begins transitioning to the output of the first flip-flop slot/input of the second flip-flop slot based on the CLKW signal.

At time T3, in response to the CLKW signal, a fourth address ADD0 and fourth write data Data0 are received on the DATAX signal at the input of the first flip-flop slot. The FLG<0> signal, the FLG<1> signal, and the FLG<2> signal all remain at the high logical value because the respective slots continue to hold valid data. Also at time T3, as the Data3 data transitions from to an output of the fourth flip-flop slot, the FLG<3> signal transitions to the high logical value. Between times T3 and T4, the Data3 begins transitioning to an output of the fourth flip-flop slot, the Data2 begins transitioning to the output of the third flip-flop slot/input of the fourth flip-flop slot, the Data1 begins transitioning to the output of the second flip-flop slot/input of the third flip-flop slot, and the Data0 begins transitioning to the output of the first flip-flop slot/input of the second flip-flop slot based on the CLKW signal.

At time T4, during a read operation and in response to the RdCLK signal, the ADD1 address is received on the ADDX signal. The ADD1 address is compared with addresses stored at the first, second, third, and fourth slots. In response to detection that the ADD1 address is stored at the second slot, the FLG<1> signal transitions to the low logical value, and the Data1 data is read out.

At time T5, during a second read operation and in response to the RdCLK signal, the ADD3 address is received on the ADDX signal. The ADD3 address is compared with addresses stored at the first, second, third, and fourth slots. In response to detection that the ADD3 address is stored at the fourth slot, the FLG<3> signal transitions to the low logical value, and the Data3 data is read out. At this stage after time T5, the bubble break has two bubbles; one at the second slot and one at the fourth slot.

At time T6, in response to the CLKW signal, a fifth address ADD4 and fifth write data Data4 are received on the DATAX signal at the input of the first flip-flop slot. The FLG<0> signal and the FLG<2> signal both remain at the high logical value because the respective slots continue to hold valid data. Also at time 716, as the Data0 data transitions to an output of the second flip-flop slot, the FLG<1> signal transitions to the high logical value. Between times T6 and T7, the Data2 begins transitioning to an output of the fourth-flip-flop slot/input of the third flip-flop slot (e.g., DATAFF2) and the Data0 begins transitioning to the output of the second flip-flop slot/input of the third flip-flop slot based on the CLKW signal.

At time T7, in response to the CLKW signal, a sixth address ADD5 and sixth write data Data5 are received on the DATAX signal at the input of the first flip-flop slot. The FLG<0> signal may remain at the high logical value because the respective slot continues to hold valid data. Also at time T7, as the Data2 data transitions to an output of the fourth flip-flop slot, the FLG<3> signal transitions to the high logical value. After time T7, the Data4 begins transitioning to the output of the second-flip-flop slot/input of the third flip-flop slot, and the Data5 begins transitioning to the output of the first flip-flop slot/input of the second flip-flop slot based on the CLKW signal.

As previously noted, the timing diagram 700 is exemplary. The timing relationships are not intended to be to scale, and it is appreciated that other timing relationships may be realized without departing from the scope of the disclosure.

Although the detailed description describes certain preferred embodiments and examples, it will be understood by those skilled in the art that the scope of the disclosure extends beyond the specifically disclosed embodiments to other alternative embodiments and/or uses of the embodiments and obvious modifications and equivalents thereof. In addition, other modifications which are within the scope of the disclosure will be readily apparent to those of skill in the art. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

What is claimed is:

1. An apparatus comprising:
   a memory device including:
      a register circuit comprising a plurality of slots to store respective addresses and data pairs, wherein, during a write operation, each slot of the plurality of slots preceding a particular slot of the plurality of slots indicated as empty is shifted by one slot to fill the particular slot such that a first end slot of the plurality of slots is made available to receive a new write address and data pair received from a memory controller via an address and data bus, respectively, wherein each slot of the plurality of slots subsequent to the particular slot retains existing address and data pairs; and
      a memory cell array configured to, during a write operation, store write data, wherein, during the write operation, the new write address and data pair are stored at the register circuit while in a low latency mode of operation and the new write data of the new write address and data pair is stored at memory cells of the memory array determined based on the new write address of the new write address and data pair while in a normal latency mode of operation, the register circuit being separate from the memory array; and
      a control circuit configured to determine whether the write operation is associated with the low latency mode of operation or the normal latency mode of operation based on a bit received with a command corresponding to the write operation, wherein the control circuit is configured to cause the write data and address to be stored at the register in response to a determination that the write operation is associated with the low latency mode of operation and to cause the write data to be stored at the memory array in response to a determination that the write operation is associated with the normal latency mode of operation, wherein the low latency mode of operation is a lower latency mode of operation than the normal latency mode of operation.

2. The apparatus of claim 1, wherein the register includes a respective flag signal corresponding to each slot of the plurality of slots, wherein the particular slot is indicated as empty based on the flag respective signal corresponding to the empty slot.

3. The apparatus of claim 1, wherein, during a read operation prior to the write operation, the particular slot is transitioned to the empty indication in response to detection that a read address matches an address of the address and data pair stored in the particular slot.

4. The apparatus of claim 3, wherein, during the read operation, the register is configured to perform an exclusive OR comparison between the read address and the address of the address and data pair stored in the particular slot.

5. The apparatus of claim 3, wherein, during the read operation, the register is configured to clear a flag signal to provide the empty indication associated with the particular slot.

6. The apparatus of claim 1, wherein, during the write operation, an empty indication corresponding to a second slot of a plurality of slots is set in response to detection that the second slot includes a previously-stored address that matches a write address of the new write address and data pair.

7. The apparatus of claim 1, wherein memory array is a dynamic, random-access memory (DRAM) array.

8. An apparatus comprising:
   a memory device comprising:
      a flag path circuit configured to maintain a first flag signal corresponding to a first respective slot of a register, a second flag signal corresponding to a second respective slot of the register, and a third flag signal corresponding to a third respective slot of the register located between the first and second respective slots, wherein the first, second, and third flag signals are configured to indicate whether the first, second, and third data slots, respectively, are empty;
      an address path circuit comprising a first latch circuit corresponding to the first slot and configured to store a first address, a second latch circuit corresponding to the second slot and configured to store a second address, and a third latch circuit corresponding to the third slot and configured to store a third address;
      an address match logic circuit coupled to the flag path circuit and to the first, second, and third latch circuits of the address path circuit, the address match logic circuit configured to compare the first, second, and third stored addresses to a received address and reset a corresponding one of the first, second, or third flag signals responsive to a match between the received address and the first, second, or third stored address, respectively,
      wherein, during a write operation and in response to the first and second flag signals indicating that the first and second slots have valid data and the third flag signal indicating that the third slot is empty, the first address is shifted to the third latch circuit to store the first address as the third address in response to the third flag signal indicating that the third slot is empty and a new write address received via an address bus from a memory controller is shifted into the first latch circuit as the first address, wherein, during the write operation, the third flag signal is transitioned to indicate that the third slot contains valid data based on the shift of the first address to the third latch circuit;

a memory array configured to, during the write operation, store new write data received via a data bus from a memory controller and corresponding to the new write address, wherein, during the write operation, the new write address and the new write data are stored at the first latch circuit and a first data latch circuit, respectively, while in a low latency mode of operation and the new write data is stored at memory cells of the memory array determined based on the new write address while in a normal latency mode of operation, the first latch circuit and the first data latch circuit being separate from the memory array; and a control circuit configured to determine whether the write operation is associated with the low latency mode of operation or the normal mode of operation based on a bit received with a command corresponding to the write operation, wherein the control circuit is configured to cause the new write address and the new write data to be stored at the first latch circuit and a first data latch circuit in response to a determination that the write operation is associated with the low latency mode of operation and to cause the new write data to be stored at memory cells of the memory array in response to a determination that the write operation is associated with the normal latency mode of operation, wherein the low latency mode of operation is a lower latency mode of operation than the normal latency mode of operation.

9. The apparatus of claim 8, wherein, during the write operation, the second address remains stored at the second latch circuit.

10. The apparatus of claim 8, wherein, during a read operation prior to the write operation, the third flag signal is transitioned to indicate that the third slot is empty indication in response to detection that a read address matches an address stored at the third latch circuit of the third slot.

11. The apparatus of claim 10, further comprising address latch logic configured to compare the read address and the address stored at the third latch circuit.

12. The apparatus of claim 8, further comprising the first data latch circuit corresponding to the first slot and configured to store first write data, a second data latch circuit corresponding to the second slot and configured to store second write data, and a third data latch circuit corresponding to the third slot and configured to store third write data, wherein, during the write operation, the first write data is shifted to the third data latch circuit to store the first write as the third write data in response to the third flag signal indicating that the third slot is empty and new write data is shifted into the first data latch circuit as the first write data.

13. A method comprising:
receiving a command and a corresponding new write address and data pair;
performing operations, based on a bit in the command, in a normal latency mode of operation or in a low latency mode of operation, wherein the low latency mode of operation is a lower latency mode of operation than the normal latency mode of operation; and
during a write operation associated with a new write address and data pair received at a memory device from a memory controller via an address and data bus, respectively:
shifting each slot of a plurality of slots of a shift register of a memory device coupled to the memory controller preceding a particular slot of the plurality of slots indicated as empty by one slot to fill the particular slot such that a first end slot of the plurality of slots is made available;
shifting the new write address and data pair into the first end slot; and
retaining existing address and data pairs in slots subsequent to the particular slot,
wherein the new write address and data pair is stored in the shift register while in the low latency mode of operation, and the new write data of the new write address and data pair is stored at memory cells of a memory array of the memory device determined based on a new write address of the new write address and data pair while in the normal latency mode of operation, the shift register being separate from the memory array.

14. The method of claim 13, further comprising detecting that the particular slot is empty based on a flag signal having a value indicating the particular slot is empty.

15. The method of claim 13, further comprising, during a read operation prior to the write operation, transitioning the particular slot to have the empty indication in response to detection that a read address matches an address stored in the particular slot.

16. The method of claim 13, further comprising, during the write operation, setting an empty indication corresponding to a second slot of a plurality of slots in response to detection that the second slot includes a previously-stored address that matches a write address of the new write address and data pair.

* * * * *